United States Patent [19]

Davis

[11] Patent Number: 4,666,366

[45] Date of Patent: May 19, 1987

[54] ARTICULATED ARM TRANSFER DEVICE

[75] Inventor: James C. Davis, Carlisle, Mass.

[73] Assignee: Aeronca Electronics, Inc., Charlotte, N.C.

[21] Appl. No.: 755,905

[22] Filed: Jul. 17, 1985

Related U.S. Application Data

[63] Continuation of Ser. No. 466,091, Feb. 14, 1983, abandoned.

[51] Int. Cl.⁴ .............................................. B65G 65/00
[52] U.S. Cl. .................................. 414/749; 414/744 R; 901/25
[58] Field of Search .................. 901/17, 25, 50, 22, 901/23; 414/749, 744 R, 733, 738, 732, 590, 222, 744 A, 744 B, 744 C, 751, 752, 753

[56] References Cited

U.S. PATENT DOCUMENTS

| | | |
|---|---|---|
| 629,698 | 7/1899 | Miller . |
| 1,204,276 | 11/1916 | Johnson . |
| 2,580,829 | 1/1952 | Peck . |
| 3,522,838 | 8/1970 | Ott . |
| 3,730,595 | 5/1973 | Yakubowski . |
| 3,823,836 | 7/1974 | Cheney et al. . |
| 3,874,525 | 4/1975 | Hassan et al. . |
| 3,921,788 | 11/1975 | Roberson, Jr. et al. . |
| 4,062,463 | 12/1977 | Hillman et al. . |
| 4,139,104 | 2/1979 | Mink ................................ 414/744 A |
| 4,208,159 | 6/1980 | Uehara et al. . |
| 4,218,173 | 8/1980 | Coindet et al. ................ 414/732 X |
| 4,275,978 | 6/1981 | Brooks et al. . |
| 4,295,780 | 10/1981 | Wada et al. . |

FOREIGN PATENT DOCUMENTS

| | | |
|---|---|---|
| 7716749 | 1/1978 | Fed. Rep. of Germany . |
| 52-44985 | 4/1977 | Japan .............................. 414/744 R |
| 57-20445 | 2/1982 | Japan . |

OTHER PUBLICATIONS

"Variable-Pitch Transfer Mechanism" (Rajac), IBM Technical Disclosure Bulletin, vol. 17, No. 6, Nov. 1974.

*Primary Examiner*—Robert J. Spar
*Assistant Examiner*—Donald W. Underwood
*Attorney, Agent, or Firm*—Fitzpatrick, Cella, Harper & Scinto

[57] ABSTRACT

In a material transfer device, an articulated arm assembly extends and retracts in a "froglike" motion to transfer an object between a plurality of locations. The articulated arm assembly is rotatable about a pivot point in a radial plane and can be raised or lowered in an axial direction.

11 Claims, 6 Drawing Figures

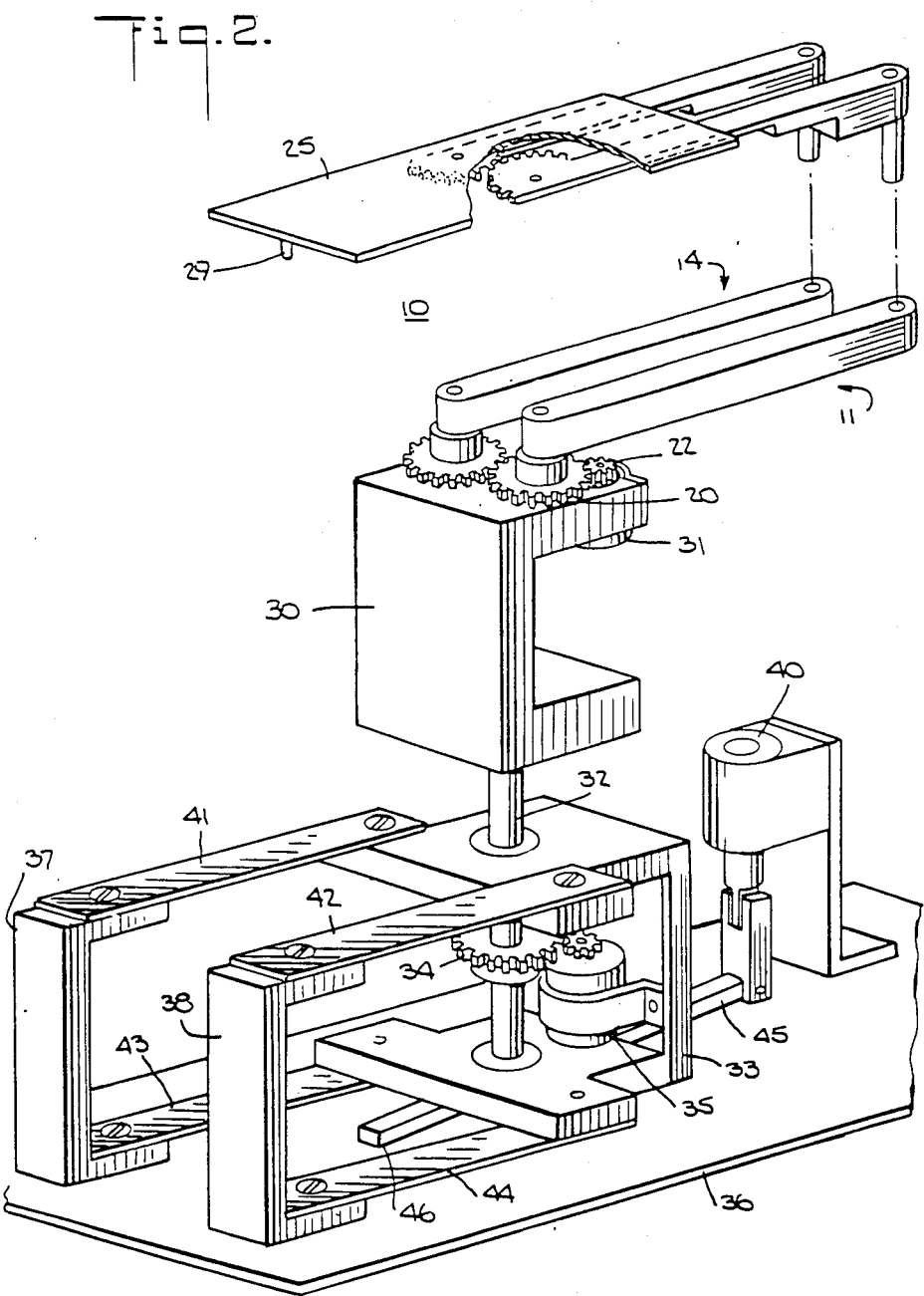

ARTICULATED ARM TRANSFER DEVICE

This application is a continuation of application Ser. No. 466,091 filed Feb. 14, 1983, now abandoned.

BACKGROUND OF THE INVENTION

1. Field of the Invention

The apparatus of the present invention relates generally to material transfer devices, and more specifically to an apparatus for transferring silicon wafers to and from a plurality of work stations.

2. Description of the Prior Art

The transfer of delicate silicon wafers or the like between a plurality of work stations or locations in the manufacture of semiconducter devices presents unique handling problems. The silicon wafers are very delicate and have highly polished surfaces. When the wafers are abruptly moved, they tend to slide. This sliding action can cause the silicon wafers to abrade or alternatively can cause damage to their edges if they collide.

There are numerous devices described in the prior art for transferring silicon wafers. For example:

U.S. Pat. 3,823,836 discloses an apparatus which includes a supply carrier with a plurality of ledges to hold the silicon wafers and a withdrawal device having a vacuum chuck. The vacuum chuck is attached to an elevator which raises and lowers the chuck. A horizontal transfer arm coupled to the vacuum chuck is used to transfer the silicon wafer from the supply carrier to a desired work station.

U.S. Pat. No. 3,730,595 discloses a wafer transfer handling apparatus having an indexable carrier for transferring wafers to and from work stations. Wafers enter and leave the wafer carrier on an air slide with the aid of a wafer ejector acceptor arm having directional air jets. The wafer ejecter acceptor arm controls the driving of the wafers into or out of the carrier from or on to the air slide which moves the wafers to or from a work station.

U.S. Pat. Nos. 4,062,463, 3,874,525 and 4,208,159 also disclose wafer transfer devices which include either pneumatic components or gripping devices for handling the wafers.

The above described devices of the prior art utilize relatively complex and costly pneumatic components or utilize undesirable gripping devices which may do damage to the delicate wafers. Moreover, the above described devices tend to be limited to the transfer of silicon wafers between fixed locations which are difficult to change.

Accordingly, there is a need for a simple and reliable transfer device that will not damage the object and that is capable of transferring objects between a plurality of locations disposed in various axial and radial planes.

SUMMARY OF THE INVENTION

The apparatus of the present invention provides a simple and reliable device for transferring objects, such as silicon wafers, camera lenses, crystal oscillators, or the like, between a plurality of locations disposed in various axial and radial planes. The apparatus includes a support, first and second articulated arms, a platform or other suitable holder coupled to the articulated arms, and a motor to drive one of the articulated arms. The two articulated arms are operatively coupled such that when one arm is driven by the motor the articulated arms extend and retract in a "froglike" or "frogkick" type of motion. The platform having the object disposed thereon is displaced in a harmonic motion as the articulated arms extend and retract, thereby minimizing the tendency of the object to slide. The articulated arm assembly is preferably coupled to a base via a rotation motor such that the entire articulated arm assembly may be rotated in a radial plane. The articulated arm assembly is also preferably coupled to the base via a plurality of flexures or levers that are responsive to a force such that the platform assembly may be displaced in an axial direction.

BRIEF DESCRIPTION OF THE DRAWING

FIG. 2 is an exploded isometric view of the apparatus of the present invention;

DESCRIPTION OF THE PREFERRED EMBODIMENTS

Figure 1:
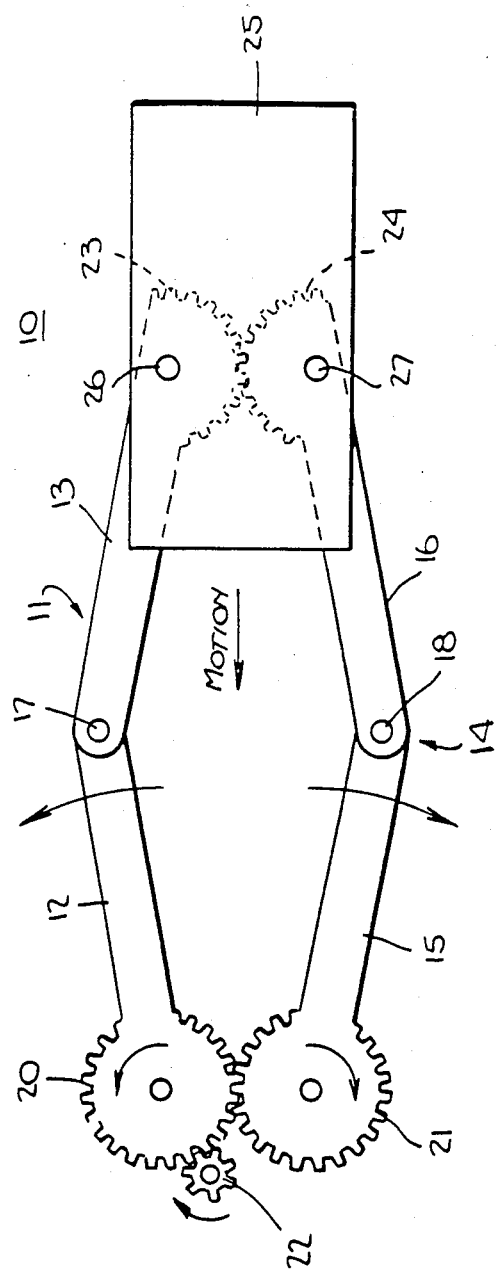
FIG. 1 is a plan view of the articulated arm assembly.

Referring now to FIG. 1, a plan view of the articulated arm assembly 10 of the apparatus of the present invention is provided. The articulated arm assembly 10 includes a first articulated arm 11 and a second articulated arm 14. The articulated arm 11 is comprised of two segments, a drive segment 12 and a driven segment 13, which are joined by a pinned connection 17. Likewise the articulated arm 14 is comprised of two segments, a drive segment 15 and a driven segment 16, which are joined by a pinned connection 18. In one embodiment the drive segments 12, 15 are of lesser length than the driven segments 13, 16.

The drive segments 12, 15 include generally circular gears 20, 21, respectively. The gears 20, 21 may be integrally formed as part of the drive segments 12, 15 or they be individually formed and affixed to the drive segments by any suitable fastening method. The gear 20 is operatively coupled to a drive pinion 22. The gear 20 is driven by the drive pinion 22 and in turn gear 20 drives gear 21.

The driven segments 13, 16 include semicircular antirotation gears 23, 24 respectively. A platform 25 or other suitable holder for carrying the object is coupled to the antirotation gears 23, 24 by bearings 26, 27. The antirotation gears 23, 24 may be replaced by frictional surfaces or cable and sheave assemblies which could also prevent the rotation of the ends of driven segments 13, 16.

It can be appreciated that as the drive pinion 22 rotates in a clockwise direction, gear 20 and drive segment 12 rotate in a counterclockwise direction, and gear 21 and drive segment 15 rotate in a clockwise direction. Consequently, the articulated arms 11, 14 retract in a "froglike" motion and displace the platform 25 in a harmonic motion torward the drive gears 20, 21. The antirotation gears 23, 24 prevent slewing of the platform 25, thereby providing a straight line motion of the object being transported.

The harmonic motion of the platform 25 is an important feature of the present invention. When the articulated arms 11, 14 are in their fully extended position the arms 11, 14 are substantially parallel. When the platform 25 is retracted from the fully extended position, the platform accelerates relatively slowly from zero velocity until it reaches the midpoint of the fully extended articulated arms where it reaches its maximum velocity. After the platform 25 reaches the midpoint, it begins to decelerate until it reaches its resting point over the gears 20, 21.

An object, such as a silicon wafer, disposed on the platform 25 may have highly polished surfaces and may be held on the platform by friction alone. Any abrupt acceleration of the platform, therefore, would cause the wafer to slide. The gentle acceleration and deceleration of the harmonic motion described above, however, minimizes the tendency of the object to slide, thereby preventing the abrasion of the object and preventing it from colliding with other objects. Where applicable, suction or clamps may be used for additional safety.

It can be appreciated that if the platform 25 is resting over the gears 20, 21 and that if the drive pinion 22 is rotated in a counter clockwise direction, then the articulated arms 11, 14 and the platform 25 will be extended in a "froglike" motion. The platform 25 will move in a harmonic motion until the articulated arms 11, 14 are fully extended.

Referring now to FIG. 2, an exploded isometric view of one embodiment of the invention is provided. The platform 25 of the articulated arm assembly 10 may include a pin 29 which cooperates with a notch to form a detent mechanism as hereinafter described. The articulated arm assembly 10 is shown as being disposed on a C-shaped support 30. An electric motor 31 is mounted on the support 30 and coupled to the drive pinion 22. The drive pinion engages gear 20 which drives gear 21 causing the articulated arm, 11, 14 to extend and retract as described above. The support 30 is coupled to a shaft 32 which is journalled in a second C-shaped support 33. The shaft 32 includes a rotation gear 34 which is coupled to an electric motor 35 which rotates the entire articulated arm assembly 10. When the platform 25 is centered above the shaft 32, any centrifugal forces on the silicon wafer being transported are eliminated.

The support 33 is coupled to a base 36 via C-shaped supports 37, 38 and flexures 41-44. A lift solenoid 40 is disposed on the base 36 and is coupled to a lever 45. The lever 45 is disposed beneath the shaft 32. There is a first fulcrum 46 disposed on the base 36 and a second fulcrum 46a disposed at the bottom of shaft 32. When the solenoid 40 is activated the shaft 32 is displaced upwards in an axial direction, thereby causing the flexures 41-44 to deflect. It can be appreciated that as the shaft 32 is displaced axially the entire articulated arm assembly 10 is also axially displaced.

Figure 3A:
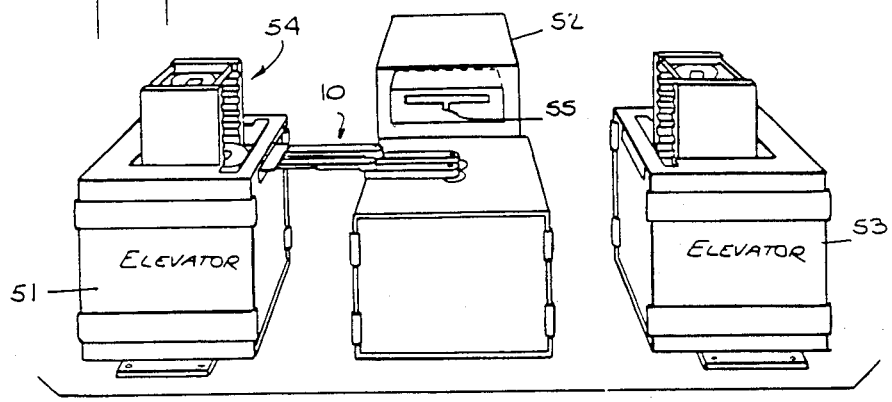
FIGS. 3A, 3B, 3C are illustrations of the operation of the apparatus of the present invention.
Figure 3B:
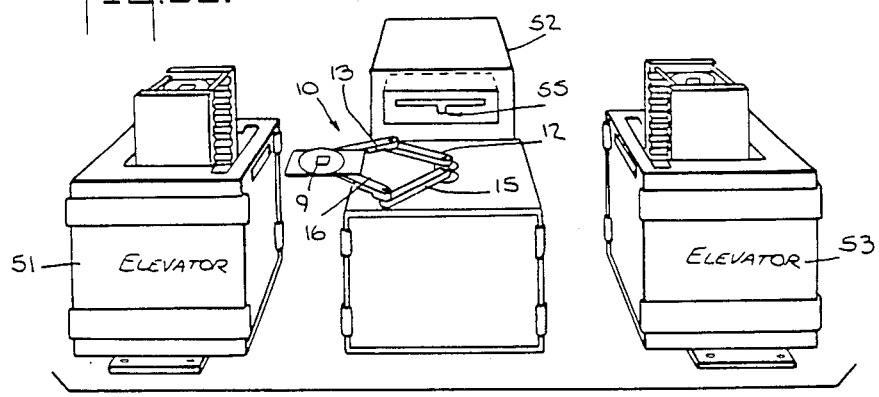
Figure 3C:
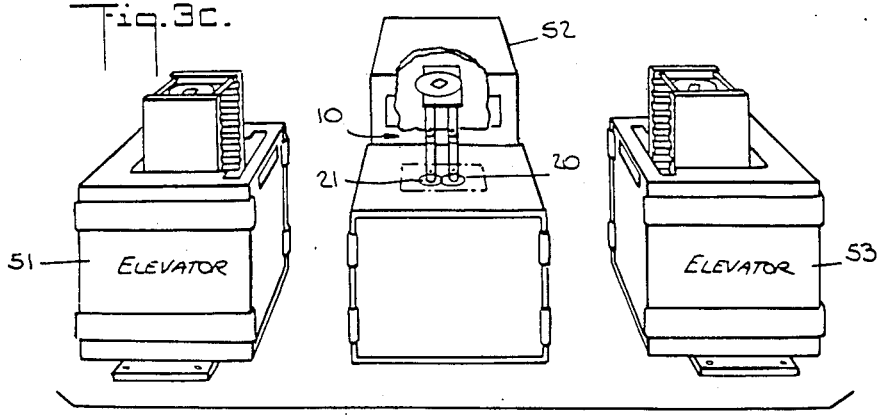
Figure 4:
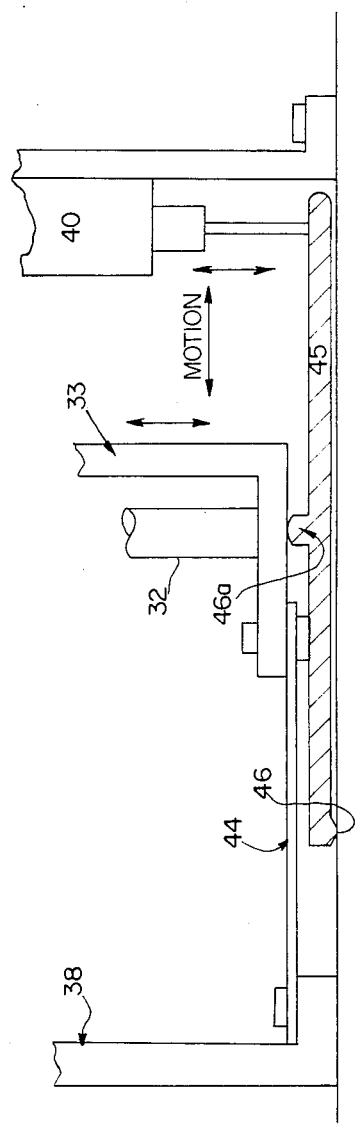
FIG. 4 is a side view, partly in section, of a detail of FIG. 2.

Referring now to FIGS. 3A, 3B, 3C, illustrations of the operation of the present embodiment are provided. The articulated arm assembly 10 is disposed between a first elevator 51, an oven 52, and a second elevator 53. A plurality of silicon wafers may be stacked in the horizontal slots of rack 54 of the elevator 51.

In FIG. 3A the articulated arm assembly 10 is illustrated as being in its extended position with the platform 25 disposed within a horizontal slot of rack 54. The elevator 51 may include a notch (not shown) which cooperates with the vertical pin 29 of platform 25 to form a detent mechanism for holding the platform 25 securely in place. Once aligned with the horizontal slot of rack 54 the platform may be raised by the lifting solenoid 40 as described above. The platform 25 is raised typically 50 to 100 milliinches in order to place a silicon wafer on the platform 25.

In FIG. 3B the drive segments 12, 15 are illustrated as being rotated in opposite directions, thereby causing the articulated arm assembly 10 to retract in a "froglike" motion. As the articulated arm assembly 10 retracts, the platform 25 is withdrawn from the vicinity of elevator 51 with a silicon wafer 9 disposed thereon.

In FIG. 3C, the articulated arm assembly 10 is depicted in dashed lines as being retracted with the platform 25 disposed over the center of rotation of the shaft 32. The entire articulated arm assembly is then rotated 90° to align the platform 25 with the opening of the oven 52. It should be noted that the articulated arm assembly 10 can be rotated through any angle desired to align it with a desired work station. The drive gears 20, 21 are then rotated in opposite directions causing the articulated arm assemble 10 to extend in a "froglike" motion until the platform 25 and the silicon wafer 9 are disposed within the oven 52. The platform 25 and silicon wafer 9 may be withdrawn from the oven 52 in a fashion similar to that described above in order to place the silicon wafer 9 in the elevator 53. The oven 52 also may include a notch 54 which cooperates with the pin 9 of platform 25 to act as a detent mechanism.

It should be noted that the motor 31, the motor 35 and the lift solenoid, 40 may be controlled by electronic logic circuits (not shown) to provide precise control of the articulated arm assembly 10. If the control is precise enough the detent mechanism comprised of the pin 9 and the notch 54 may not be necessary.

Referring back to FIG. 1, it should be noted that if the drive segments 12, 15 are of equal length to the driven segments 13, 16 the operation of the articulated arms 11, 14 will be affected significantly. Instead of the platform 25 coming to rest over the drive gears 20, 21 as described above, the platform 25 will extend past the drive gears if the drive segments 12, 15 and the driven segments 13, 16 are of equal length.

For example, if in FIG. 3B the drive segments 12, 15 and the driven segments 13, 16 are of equal length, the platform 25 may be retracted from the elevator 51 and extended to the elevator 53 without any rotation of the articulated arm assembly 10. If the drive segments 12, 15 are of lesser length than the driven segments 13, 16, the platform 25 will come to rest over the drive gears 20, 21 when it is retracted from the elevator 51 as described above. The entire articulated arm assembly 10 then must be rotated 180° to align the platform 25 with elevator 53, before the articulated arm assembly can be extended.

While the invention has been described in its preferred embodiments, it is to be understood that the words which have been used are words of description rather than limitation and that changes within the purview of the appended claims may be made without departing from the true scope and spirit of the invention in its broader aspects.

I claim:

1. An apparatus for transferring objects, comprising: a support;

first and second articulated arms supported on said support;

said first articulated arm having a drive segment disposed for rotation about a first axis and a driven segment;

said second articulated arm having a drive segment disposed for rotation about a second axis and a driven segment, said drive segment of said second articulated arm being coupled to and driven by rotation of said drive segment of said first articulated arm;

holding means pivotally coupled to said driven segments of said first and second articulated arms, said driven segments being engaged so as to prevent rotation of said holding means;

means capable of driving said drive segment of said first articulated arm for rotation through an angle in the range of from at least 120 degrees up to and including 180 degrees at a constant rotational speed to move said holding means between an extended position and a retracted position such that said holding means moves with harmonic motion, whereby said holding means, at the limits of its movement, has zero velocity and undergoes minimum acceleration.

2. An apparatus according to claim 1 wherein said drive segments are lesser in length than said driven segments.

3. An apparatus according to claim 1 wherein said driven segments and said drive segments are of equal length.

4. An apparatus according to claim 2 or 3, which further includes axial displacement means for raising and lowering said support.

5. An apparatus according to claim 4 wherein said support is coupled to a base via a shaft with a rotation gear and a first motor.

6. An appartus according to claim 5 wherein said drive and driven segments are joined by a pinned connection.

7. An apparatus according to claim 6 wherein said gear means coupled to said drive segments of said first and second articulated arms include circular gears disposed at one end of said drive segments and said circular gear coupled to said first articulated arm being responsive to said driving means which includes a second motor.

8. An apparatus according to claim 7 wherein said antirotation means comprise antirotation gears disposed at one end of each of said driven segments.

9. An apparatus according to claim 8 wherein said holding means includes a platform which is coupled to said antirotation gears by bearings.

10. An apparatus for transferring objects, comprising:
a support;
first and second articulated arms supported on said support;
said first articulated arm having a drive segment disposed for rotation about a first axis and a driven segment joined to said drive segment by a pinned connection;
said second articulated arm having a drive segment disposed for rotation about a second axis and a driven segment joined to said drive segment of said second articulated arm by a pinned connection, said drive segment of said second articulated arm being coupled to said driven by rotation of said drive segment of said first articulated arm; said drive segments being lesser in length than said driven segments;
holding means pivotally coupled to said driven segments of said first and second articulated arms, said driven segments being engaged with each other by means of anti-rotation gears disposed at one end of each of said driven segments so as to prevent rotation of said holding means; said holding means including a platform coupled to said anti-rotation gears by bearings;
means capable of driving said drive segment of said first articulated arm for rotation through an angle in the range of from greater than 90 degrees up to and including 180 degrees at a constant rotational speed to move said holding means between an extended position and a retracted position such that said holding means moves with harmonic motion, whereby said holding means, at the limits of its movement, has zero velocity and undergoes minimum acceleration; and axial displacement means for raising and lowering said support, said support being coupled to a base via a shaft with a rotation gear and a first motor;

wherein said drive segments of said first and second articulated arms include circular gears disposed at one end of said drive segments, said circular gear coupled to said first articulated arm being responsive to said driving means which includes a second motor; and wherein said axial displacement means includes a plurality of flexures and a solenoid, wherein said solenoid is for applying a force to move said support vertically and said flexures are so arranged relative to said base and said solenoid as to flex when said support moves vertically.

11. An apparatus for transferring objects, comprising:
a support;
first and second articulated arms supported on said support;
said first articulated arm having a drive segment disposed for rotation about a first axis and a driven segment joined to said drive segment by a pinned connection;
said second articulated arm having a drive segment disposed for rotation about a second axis and a driven segment joined to said drive segment of said second articulated arm by a pinned connection, said drive segment of said second articulated arm being coupled to and driven by rotation of said drive segment of said first articulated arm; said drive segments being equal in length to said driven segments;
holding means pivotally coupled to said driven segments of said first and second articulated arms, said driven segments being engaged with each other by means of anti-rotation gears disposed at one end of each of said driven segments so as to prevent rotation of said holding means; said holding means including a platform coupled to said anti-rotation gears by bearings;
means capable of driving said drive segment of said first articulated arm for rotation through an angle in the range of from greater than 90 degrees up to and including 180 degrees at a constant rotational speed to move said holding means between an extended position and a retracted position such that said holding means moves with harmonic motion, whereby said holding means, at the limits of its movement, has zero velocity and undergoes minimum acceleration; and axial displacement means for raising and lowering said support, said support being coupled to a base via a shaft with a rotation gear and a first motor;

wherein said drive segments of said first and second articulated arms include circular gears disposed at one end of said drive segments, said circular gear coupled to said first articulated arm being responsive to said driving means which includes a second motor; and wherein said axial displacement means includes a plurality of flexures and a solenoid, wherein said solenoid is for applying a force to move said support vertically and said flexures are so arranged relative to said base and said solenoid as to flex when said support moves vertically.

* * * * *

UNITED STATES PATENT AND TRADEMARK OFFICE
CERTIFICATE OF CORRECTION

PATENT NO. : 4,666,366

DATED : May 19, 1987

INVENTOR(S) : James C. Davis

It is certified that error appears in the above-identified patent and that said Letters Patent is hereby corrected as shown below:

Column 5, line 53, "to said driven" should read --to and driven--.

Signed and Sealed this

Eighteenth Day of August, 1987

*Attest:*

DONALD J. QUIGG

*Attesting Officer*      *Commissioner of Patents and Trademarks*